(12) United States Patent
Stroet

(10) Patent No.: US 6,408,010 B1
(45) Date of Patent: Jun. 18, 2002

(54) TDMA MASTER-SLAVE FILTER TUNING

(75) Inventor: Petrus Martinus Stroet, Sunnyvale, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/104,378

(22) Filed: Jun. 25, 1998

(30) Foreign Application Priority Data

Jun. 25, 1997 (EP) .............................................. 97201947

(51) Int. Cl.[7] .............................. H04J 3/06; H03D 3/24; H04B 1/16; H04B 1/10
(52) U.S. Cl. ........................ 370/503; 370/337; 375/335; 455/343; 327/552
(58) Field of Search ................................ 370/321, 337, 370/318, 347, 503, 509, 510, 512–514, 516–311, 375; 375/354, 359, 364, 371, 375, 376; 455/161.1, 161.2, 189.1, 191.1, 193.2, 196.1, 197.3, 258, 259, 307, 339, 340, 343, 574, 324, 331; 327/552–558, 544; 331/25, 47, 40, 117

(56) References Cited

U.S. PATENT DOCUMENTS 5,117,205 A * 5/1992 Nauta .......................... 331/117
5,594,735 A * 1/1997 Jokura ......................... 370/337
5,731,737 A * 3/1998 Cranford ..................... 327/553

FOREIGN PATENT DOCUMENTS

EP 0455298 A1 11/1991

OTHER PUBLICATIONS

Schaumann, Design of continuous time fully integrated filters, Aug. 1989, IEEE, vol. 136, No. 4, pp. 184–190.*
Patent Abstracts Of Japan, vol. 017, No. 381 (P–1574), Jul. 16, 1993 and JP 05 061480A (Daikin Ind. Ltd.), Mar. 12, 1993.

* cited by examiner

*Primary Examiner*—Huy D. Vu
*Assistant Examiner*—Steven Nguyen
(74) *Attorney, Agent, or Firm*—Burns, Doane, Swecker & Mathis, L.L.P.

(57) ABSTRACT

A Time Division Multiple Access (TDMA) radio communication device is arranged for receiving radio signalling and information data in receive time slots. The radio communication device includes receiver circuitry for the filtering of received radio signals using a filter. The filter includes a tunable filter part and a tunable oscillator or resonator part, operatively connected such that control signals operative for the tuning of the oscillator part are also operative for the tuning of the filter part. A detector for the detection of the oscillator operation, a reference source and a comparator are arranged to provide the tuning control signals for the oscillator to operate in accordance with the reference source. The filter includes storage for storing the tuning control signals if said filter is made inoperative and for starting up the filter by using the stored tuning control signals.

10 Claims, 5 Drawing Sheets

TDMA MASTER-SLAVE FILTER TUNING

This application claims priority under 35 U.S.C. §§119 and/or 365 to 97201947.5 filed in Europe on Jun. 25, 1997; the entire content of which is hereby incorporated by reference.

FIELD OF THE INVENTION

The present invention relates generally to wireless telecommunication system, and more specifically to master-slave filter tuning in a TDMA (Time Division Multiple Access) radio communication system.

BACKGROUND OF THE INVENTION

In modern wireless telecommunication systems, such as the well-known cellular GSM (Global System for Mobile communications) and DECT (Digital Enhanced Cordless Telecommunication) telephone and data transmission systems, savings in component space, manufacturing costs and power consumption are important design issues.

In present DECT radio receivers, for example, the required selectivity is achieved by using a so-called SAW (Surface Acoustic Wave) band-pass filter. DECT is a Multi Carrier/Time Division Multiple Access/Time Division Duplex (MC/TDMA/TDD) digital radio access technique, having 10 radio carriers each provided 24 time slots, i.e. 12 receive and 12 transmit slots, serving 12 duplex communication channels, called a frame. The data and control bits are transmitted at a system clock frequency or system bit rate of 1152 kb/s.

At the receiving part of a typical double super-heterodyne DECT receiver, signals in the DECT frequency band (1880 to 1900 MHz) are down converted to a first IF (Intermediate Frequency) adapted for filtering of the down converted signal by the SAW-filter having a pass band of 1.152 MHz centered the first IF (typically 110 MHz). In a further conversion step the filtered signal is down converted to a second IF (typically 10 MHz) for further processing of the data.

SAW-filters have to be produced in a separate production process, resulting in a distinct (rather bulky) package. As a result, SAW-filters contribute significantly to the total costs, space and power requirements of a radio receiver.

Replacing SAW-filters by semi-conductor integrated filters, such as filters constructed from building blocks comprising transductor stages and capacitors, due to manufacturing process tolerances, up to 25% absolute difference in the actual and designed RC-product (Resistance times Capacitance value) of integrated components can occur.

To compensate for this huge error, the so-called master-slave tuning principle can be used, wherein the filter is made tunable to the correct or required operational characteristics. The tuning information is obtained from a tunable oscillator or resonator circuit. This oscillator or resonator circuit is built of the same building blocks as the filter and manufactured in the same production process (chip) like the filter.

By tuning the oscillator or resonator circuit to operate at its signal amplitude and frequency design values, the tuning signals can be also applied to tune the filter which, as a result, generally will operate within 1% of its design values. This accuracy is sufficient for most practical applications.

In normal operation, the receiver of a TDMA radio device is only operative during the receive time slot comprising signalling and information data for the device. In DECT, for example, for the activation of the receiver, a signal is available some 10 µs before receiving the data. That is, the receiver circuitry has to be powered up and ready for receipt within the above 10 µs interval. Accordingly, if the receiver circuitry can not be powered-up during this interval, the receiver should be powered-up for the complete receiving frame half, which is generally not acceptable in view of power consumption requirements.

Due to the relatively high quality (Q) factor of the oscillator or resonator circuit used in the master-slave filter configuration, for obtaining the required tuning accuracy, the time for powering-up the oscillator and its detection circuitry is relatively long. Without additional measures, the master-slave filter concept is in general not suitable for use in receivers of present TDMA radio communication devices.

SUMMARY OF THE INVENTION

In view of the above, it is an object of the present invention to provide a novel master-salve filter concept for use in TDMA radio receiver equipment meeting the power requirements as to the time of the operation and stand-by of a battery powered radio communication device, and such that SAW filters can be avoided.

It is a further object of the invention to provide such filter adapted for integration in an RF (Radio Frequency) analog ASIC (Application Specific Integrated Circuit) radio transceiver device providing the required selectivity, thereby effectively limiting the number of separate components of a PCB (Printed Circuit Board) and reducing the space requirements and weight of the radio equipment.

It is also an object of the invention to provide a radio communication unit for use in a cordless or cellular radio communication system comprising the novel filter concept.

These and other objects and features are achieved according to the present invention in a Time Division Multiple Access (TDMA) radio communication device arranged for receiving radio signalling and information data in receive time slots, comprising receiver circuitry having control means and filter means for the filtering of received radio signals. The filter means comprise a tunable filter part and a tunable oscillator or resonator part, operatively connected such that control signals operative for the tuning of the oscillator part are also operative for the tuning of the filter part, detector means for the detection of the oscillator operation, reference source means and comparator means, arranged to provide said tuning control signals from said detector means for the tuning of the oscillator to operate in accordance with the reference source means, and storage means for storing said tuning control signals if said filter means are made inoperative and for starting up said filter means by using said stored tuning control signals.

With the present invention a very fast start-up of the filter means can be achieved, because the tuning control signals are directly available from the storage means, thus avoiding the time required for the oscillator or resonator part to provide quasi-stable tuning control signals after powering-up.

In the concept according to the invention it is assumed that previously stored tuning control signals are still valid at a subsequent start-up of the filter means. This is a valid assumption in particular in a further embodiment of the invention in a TDMA radio communication device comprising timing and synchronisation control means, wherein under the control of said timing and synchronisation control means said tuning control signals are stored at the end of a receive time slot or slots in a frame and wherein said stored tuning control signals of said frame are enabled for starting up said filter means for the receipt of a receive time slot or slots of a subsequent frame.

In case of DECT, for example, the filter means according to the present invention can be ready for the receipt of a received time slot within the interval of 10 μs, as described.

Preferably, the filter means, i.e. the filter part and oscillator or resonator part thereof, are digitally controllable means, whereas the storage means are arranged for storing tuning control signals in a digital format. Preferably, the digital storage means are of a type, which, if not operative, can be set in a low power consuming sleep mode. Accordingly, a further reduction of the power consumption is achieved resulting in longer operation time using the same battery.

In a yet further embodiment of the invention, the detector means comprise amplitude detector means and frequency detector means for the detection of the amplitude and frequency of the output signal of said oscillator part, said reference means being arranged for setting an amplitude and frequency of the oscillator output signal, and wherein said comparator means provide amplitude or quality (Q) tuning control signals and frequency tuning control signals for tuning said oscillator part and said filter part of said filter means.

The or each detector means, comparator means and reference source means, in a yet further embodiment of the invention, may comprise digitally operating means.

In the preferred embodiment of the invention, the filter part and oscillator part of the filter means comprise tunable transconductor transistor stages which are integrated in one and the same semi-conductor circuit during the same manufacturing process. As a result, instead of several space occupying components, a single component is achieved providing the required selectivity and operational characteristics for use in a receiver of, for example, the single super heterodyne type.

The master-slave filter tuning according to the invention is in particular suitable for use in a transceiver ASIC (Application Specific Integrated Circuit) arranged for use in TDMA radio transceiver means.

The invention relates further to a remote communication unit, such as a radio telephone for use in TDMA radio communication system, comprising transceiver means, timing and synchronisation control means, and information and signalling processing means, wherein the transceiver means comprise filter means according to the present invention.

The above-mentioned and other features and advantageous of the invention are illustrated in the following description with reference to the enclosed drawings.

DETAILED DESCRIPTION OF THE EMBODIMENTS

Without the intention of a limitation, the invention will now be explained by its application in a cordless radio telephone system operating in accordance with the DECT standard.

Figure 1:
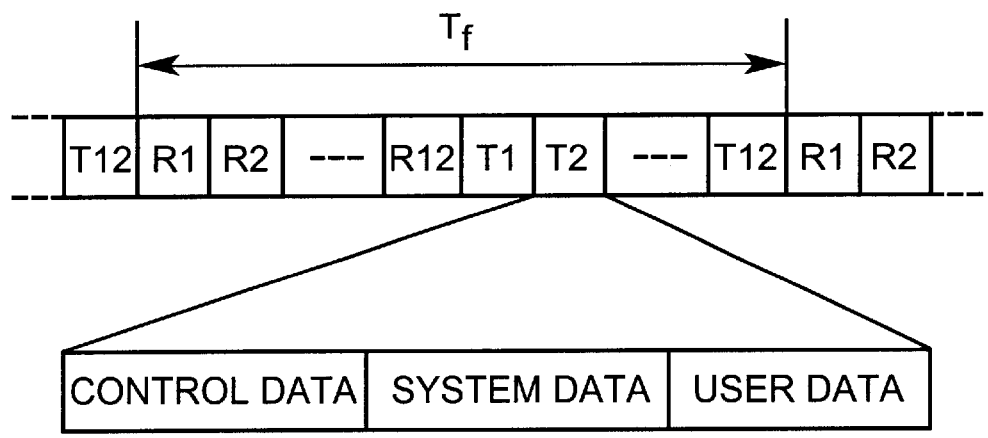
FIG. 1 shows, in a schematic and illustrative manner, a DECT receive and transmit time slot data signal structure.

In DECT, the information over the air is transmitted using a frame structure shown in FIG. 1. During the first half of the frame, i.e. the first twelve time-slots designated R1, R2, . . . R12, data from a radio access unit or base station are received by a remote radio communication unit, such as a portable radio telephone, whereas in the second half of each frame, i.e. the second twelve time-slots designated T1, T2, . . . T12, the remote communication units transmit data to the radio access units. A radio communication link between a radio access unit and a remote communication unit is assigned a slot in the first half of the frame and a slot bearing the same number in the second half of the frame. Each time-slot typically contains control data, system data and information or user data.

Including guard space, the total number of bits per time slot according to the DECT standard amounts to 480. These bits are transmitted at a system clock frequency or system bit rate of 1152 kb/s, resulting in a frame cycle time $T_f$ of 10 msec.

Figure 2:
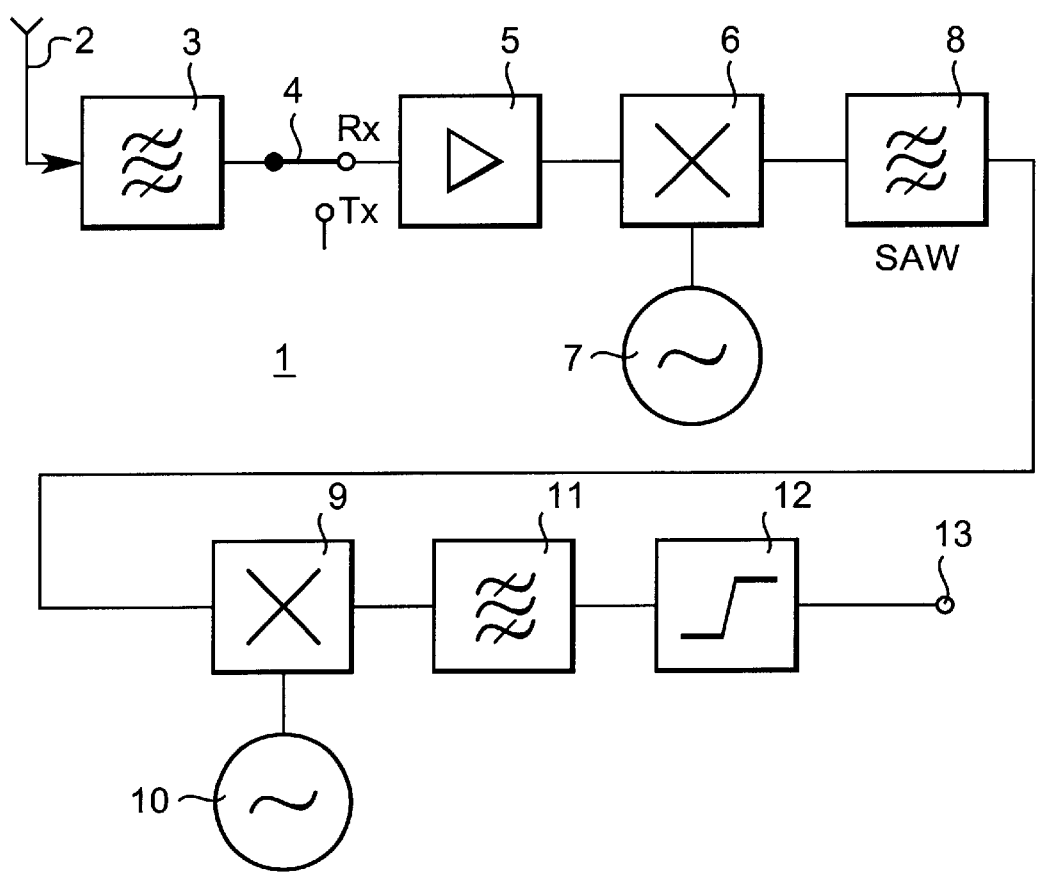
FIG. 2 shows a block diagram of a typical prior art double super-heterodyne receiver circuit.

FIG. 2 shows a typical prior art double super-heterodyne receiver circuit block diagram, which is currently used in DECT portable radio telephones.

Radio signals at the receiver 1 are received via an antenna 2 at a 20 MHz wide band-pass filter, having a centre frequency of 1890 MHz, to filter signals outside the DECT band (1880 tot 1900 Mhz).

The filtered signal is fed to a transmit (Tx)/receive (Rx) switch 4, which is controlled to switch between the receive and transmit halfs of a frame under the control of timing and synchronisation control means (not shown). The received signals are inputted to a low-noise amplifier 5 and down converted to a first Intermediate Frequency (IF) of 110 MHz, using a first mixer 6 and a first local oscillator 7.

The down converted signal is fed to a SAW (Surface Acoustic Wave) band-pass filter, having a band width of 1.152 MHz to filter adjacent channels.

After filtering by the SAW-filter 8 the received signal is further down converted to a second IF at 10 MHz by a second mixer 9 and second local oscillator 10. After passing a band pass filter 11 tuned at 10 MHz and a limiter 12, the received signalling and information data are provided at an output terminal 13 for further processing thereof.

The SAW-filter 8 is applied for providing the required selectivity of the receiver. However, as described in the preamble, SAW-filters are separate components which can not be integrated in the same semi-conductor device like the mixer, oscillator, the amplifier and limiter circuits of the receiver 1.

During use, if applied in a portable radio handset, for example, the receiver 1 is only switched operative during the relevant receive time slot or slots containing information to be received by the handset. Accordingly, the receiver is idle for approximately 90% of a frame, which provides a considerable saving of battery power. This saving has to be maintained or even be enhanced when using an integrated filter concept for the replacement of the (bulky) space and power consuming and costly SAW-filters.

Replacing SAW-filters by semi-conductor integrated filters, manufacturing process tolerances up to 25% have to be encountered, which require tunable filter means based on the so-called master-slave principle.

Figure 3:
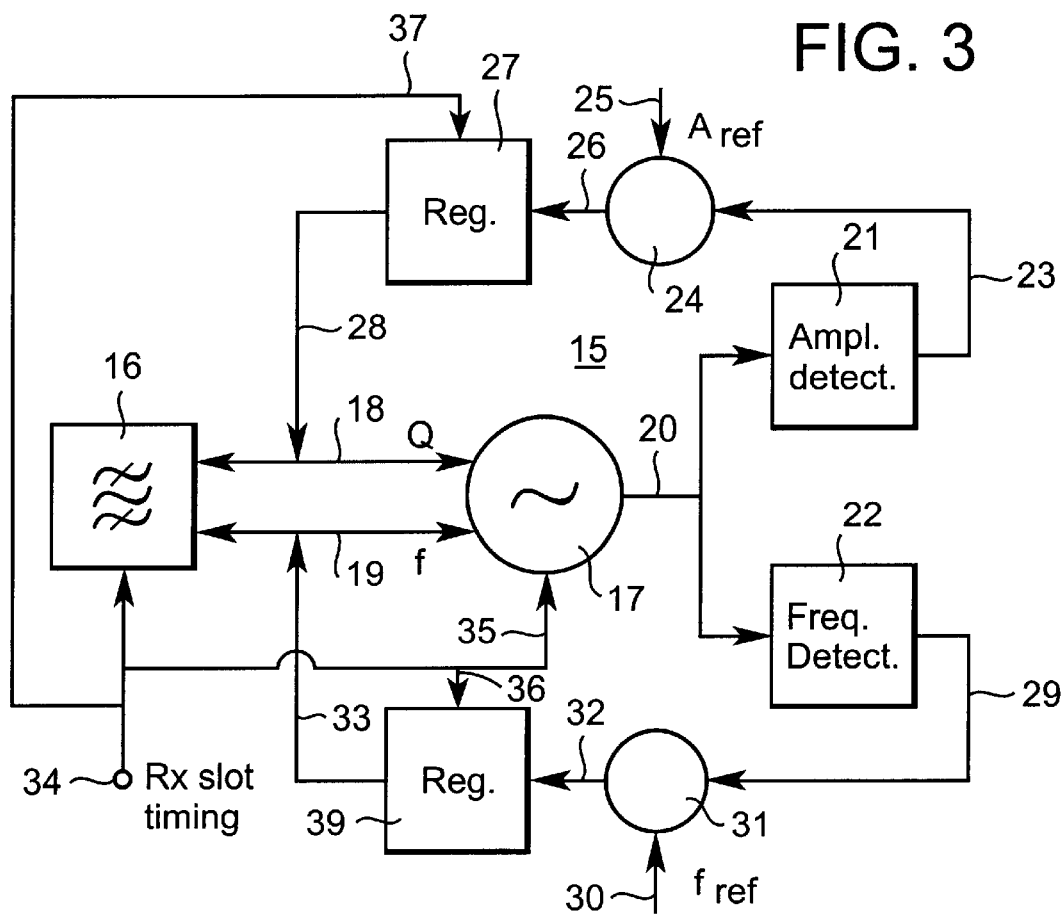
FIG. 3 shows a block diagram of a master-slave filter concept according to the present invention for use in a TDMA radio communication system.

FIG. 3 shows a novel filter concept according to the present invention, for replacing the SAW-filter in receiver circuits, which filter concept has been designed to meet the required fast start-up times in TDMA radio communication devices.

The filter concept 15 of the invention comprises a filter part 16 and a resonator or oscillator part 17. The filter part 16 and the oscillator part 17 have common tuning control inputs 18, 19, such that the tuning information applied to the oscillator 17 is also applied to the filter part 16. In this embodiment, it is pre-supposed that the oscillator part 17 and the filter part 16 are made of the same tolerance dependent building blocks. This in order to achieve optimum tuning, without additional correction or adaptation circuitry.

Connected to the output 20 of the oscillator 17 are an amplitude detector 21 and a frequency detector 22. Amplitude and frequency detection circuits are known to those skilled in the art, such that no further discussion seems necessary. Both circuits can be provided in analog as well as digital form.

The output 23 of the amplitude detector 21 is connected to an input of a comparator 24, at another input 25 of which an amplitude reference signal $A_{ref}$ from reference source means is applied.

At the output 26 of the comparator 24 a signal is supplied indicative of the differences between the current amplitude of the oscillator 17 and the design amplitude, as represented by $A_{ref}$.

This output is fed to a regulator circuit 27, the output 28 of which provides a first tuning control signal for the oscillator part 17 and the filter part 16.

Suitable comparator means and regulator means are known in the art, both analog and digital.

Likewise, a second tuning control signal 33 for tuning the frequency of the oscillator 17 is achieved through the frequency detector 22, the output 29 of which and a frequency reference signal $F_{ref}$ 30 from frequency reference source means are supplied to the input of a comparator 31. The output of the comparator 31 is indicative of a frequency deviation between the current frequency and the design frequency of the oscillator 17 and is inputted to a regulator 39 providing the frequency tuning control signal 33.

In accordance with the present invention, the regulators 27 and 39 are arranged for storing the tuning control signals 28 and 33 under the control of an Rx slot timing signal provided at a terminal 34, which connects to a control input 35 of the oscillator part 17, a control input 36 of the regulator 39, a control input 37 of the regulator 27 and, optionally a control input of the filter part 16.

In the case of digital regulators 27, 39, the tuning control signals 28 and 33 may be digitally stored, preferably in a digital storage means of the type which, if not operative, is set in a low power consuming sleep mode. This, to achieve a low as possible power consumption. It will be obvious for those skilled in the art, that the tuning control signals can be stored in several manners, and not necessarily in the regulators 27 and 39. Further, separate means may be provided for storing the tuning control information, or the relevant information may be stored in either the filter part 16 or the oscillator part 17, for example. This, provided that the stored information is accessible during start-up of the filter means 15.

In a TDMA radio communication device, the filter means 15 are operated such that at the end of a receive slot or receive slots in a frame, the tuning control signals 28 and 33 are stored and the filter means 15 are switched inoperative. In order to receive data in the receive slot or slots of a subsequent frame, the filter means 15 are powered up and tuned using the stored tuning control signals 28, 33 of the previous frame. By assuming that the stored tuning control signals are still valid, which is most likely the case during an ongoing communication, a very rapid start-up of the filter part 16 is possible, without having to wait for the relatively long time after which the oscillator 17 has become stable, i.e. that the tuning control signals 28 and 33 are readily available.

In particular, in the case of filter means which have to provide a high selectivity, it can take a considerable time before the oscillator is in its stable mode of operation, due to the high quality (Q) factor required for obtaining accurate tuning control signals of the filter means 15.

Figure 4:
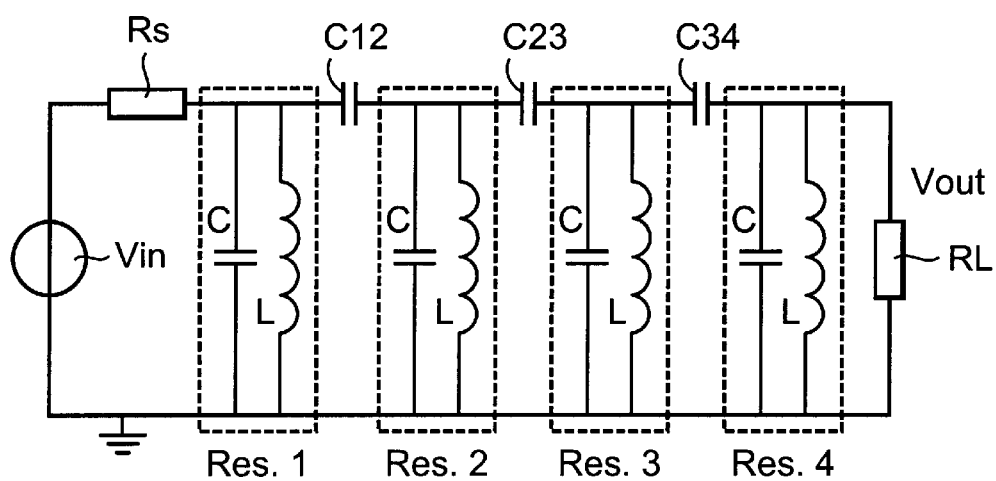
FIG. 4 shows a simplified diagram illustrating the filter according to the present invention.

FIG. 4 shows a simplified circuit diagram of a filter which provides the required selectivity for operation in DECT radio communication equipment.

There is shown an eight-order filter structure, consisting of four capacitively coupled resonators (RES 1, 2, 3, 4) with termination resistors Rs (at the input) and RL (at the output) of the filter. The resonators 1, 2, 3, and 4 are coupled through capacitors C12, C23 and C34, respectively. Vin represents an input signal and Vout represents an output signal of the filter.

Figure 5:
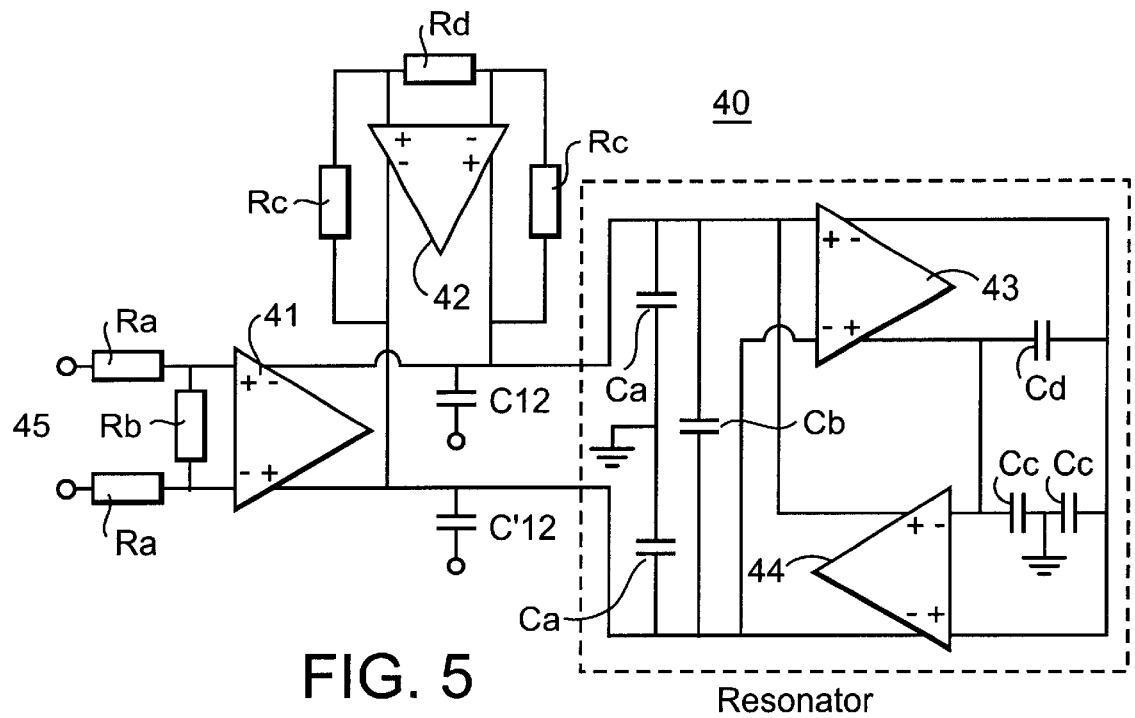
FIG. 5 shows a block diagram of part of a semi-conductor intergratable filter design according to the simplified diagram of FIG. 4.

Each resonator 1, 2, 3, 4 is implemented by two anti-parallel transconductors 43, 44 connected with capacitors Ca, Cb, Cc, Cd as shown in the block diagram of FIG. 5. The capacitors are split into a common part Ca to avoid common-mode instability and a differential part Cb. This also provides a faster start-up behaviour, because of the reduced common part capacitance forming a time constant with the relatively high common mode output resistance of the transconductors 43, 44. The oscillator 17 (FIG. 3) is designed to match the resonator to extract frequency and amplitude information in order to tune the filter as described above. Filter input circuitry is provided, comprising transconductors 41 and 42 and appropriate resistors Ra, Rb, Rc, Rd in order to provide a balanced filter design, for use with balanced mixer, amplifier and limiter circuits shown in FIG. 2. Capacitors C12, C'12 provide the coupling to another resonator, such to provide the filter circuit shown in FIG. 4.

Figure 6:
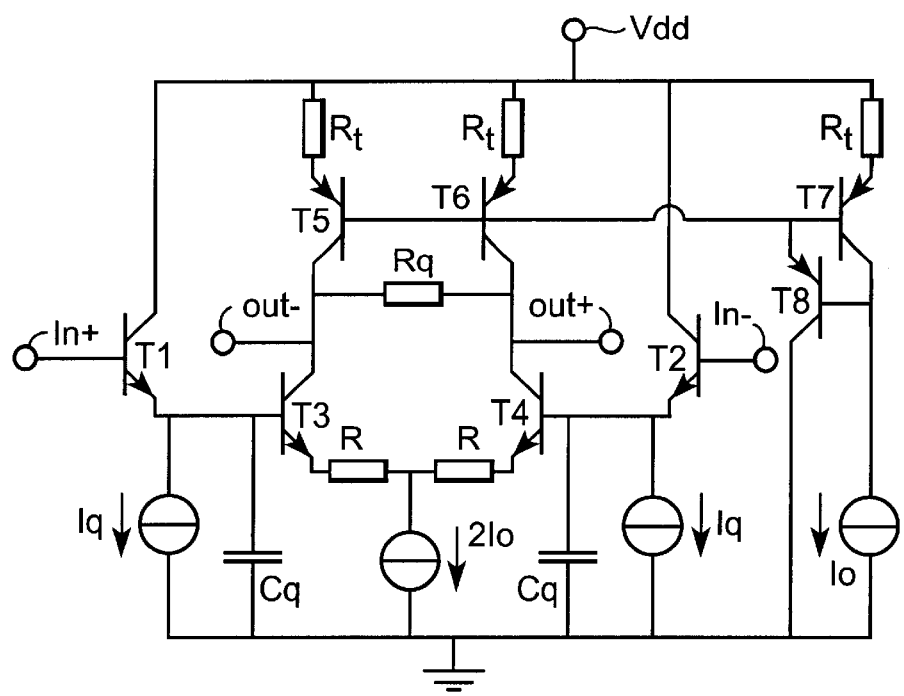
FIG. 6 shows a circuit diagram of a transconductor stage according to the present invention, for use as a transconductor stage of FIG. 5.

Each transconductor 41, 42, 43, 44 is implemented as shown in FIG. 6. The common mode feed back circuit is not shown. Emitter degeneration is used for transconductor linearisation. The frequency tuning is realized by switching on or off an array of parallel emitter-degenerated differential pairs T3, T4. The resonator quality factor is determined by Rq, Cq and the emitter resistance of the input transistor T1 and T2. Therefor, Q—or amplitude tuning can easily be realized by adjusting the bias current Iq of the input transistors. Rq is chosen to set the phase of the transconductorcapacitor combination to −90° at the midfrequency $f_0$ of the filter. Varying Iq results in a phase tuning range. All transconductors are equal and identical to facilitate good matching and to provide an equal input voltage range of each stage.

The filter is implemented in a 15 GHz $F_T$ bipolar process, which is also used for providing transceiver ASIC's for TDMA, DECT transceiver equipment.

The transistors T5, T6, T7 and T8 as well as the resistors Rt are provided to set the current in the differential pair T3, T4. IQ, Io and 2Io represent current sources, such as well known in the state of the art.

Figure 7:
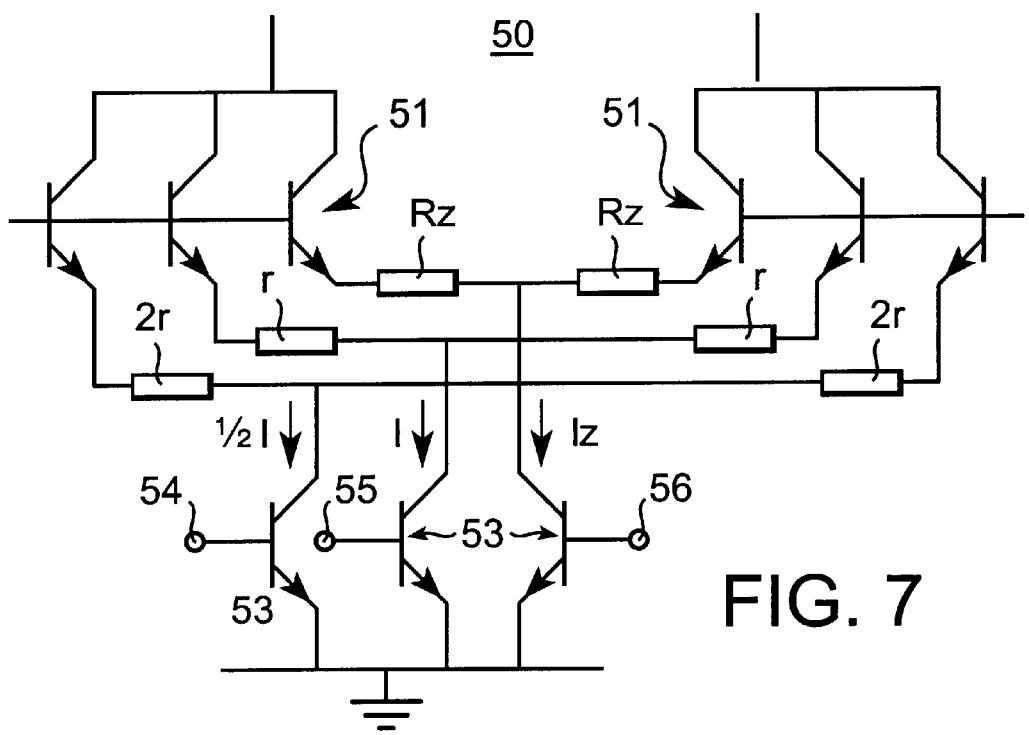
FIG. 7 shows part of the transconductor circuit diagram of FIG. 6, in order to make the transconductor circuit digitally tunable.

FIG. 7 shows a transconductor according to FIG. 6, which is equipped for digital frequency tuning by switching on or off an array of parallel emitter-degenerated differential pairs 51. In the circuit of FIG. 6 T3, R, R, T4 and the current source 2Io are replaced by the circuit of FIG. 7.

The differential pair with Rz is always active and will set the minimum required transconductance. The transconductance of the most significant differential pair with resistors r is chosen to give an nominal transconductance together with pair Rz. The less significant pairs are having a degeneration resistor 2r, 4r, 8r etc. By choosing the currents ½I, ¼I, ⅛I the voltage across the degeneration resistors will be constant and, therefore, all degenerated differential pairs will clip at the same (high) signal level. Switching of the differential pairs can be obtained through the switching resistors 53 via their switching inputs 54, 55 and 56, respectively.

For convenience sake, in FIG. 7 only a limited number of differential pairs 51 has been shown.

Figure 8:
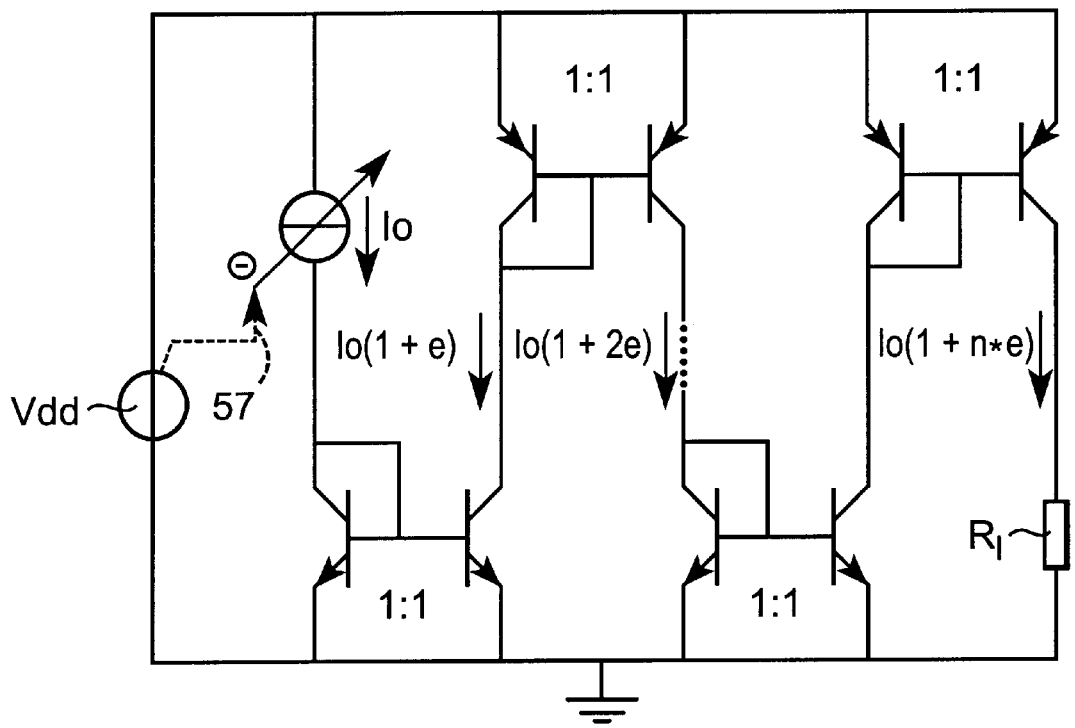
FIG. 8 shows a circuit diagram of an Early-effect compensation circuit used with the transconductor circuit shown in FIGS. 6 and 7.

FIG. 8 shows a further circuit for use with the transconductor according to FIGS. 6 and 7 for compensation of the well known Early-effect.

In the circuit shown in FIG. 8, which comprises a number of current mirror circuits having an equal transfer rate, the influence of the Early-effect across the collector and emitter terminals of a current mirror circuit, indicated by e is compensated by lowering the reference current lo if the supply power Vdd is increased, indicated with the dotted line 57 in FIG. 8. With this measure, a supply voltage regulator is avoided, thereby avoiding the additional 300 mV supply voltage loss which in low-voltage applications can lead to a considerable increase in the dynamic range of the filter.

For further details concerning the filter and transconductor design, reference is made to the report "Realisation of a 10 MHz integrated bipolar DECT band-pass filter", by P. M. Stroet, University of Twente, which report is herein incorporated by reference.

Figure 9:
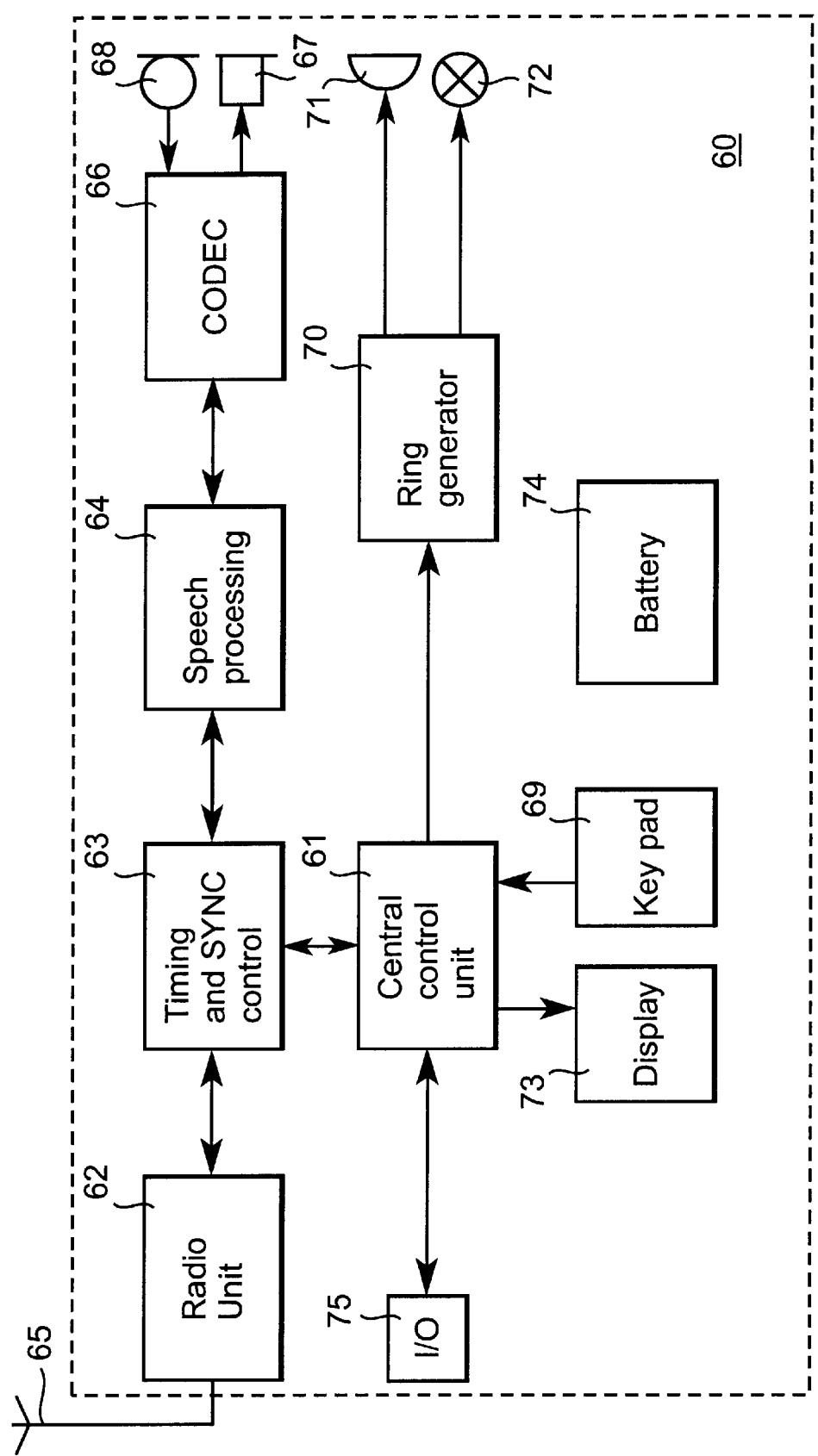
FIG. 9 shows a simplified block diagram of a TDMA radio communication unit taking the form of a telephone set having transceiver circuitry comprising the master-slave filter concept according to the present invention.

FIG. 9 shows a simplified block diagram of a radio telephone set comprising frequency or clock control circuitry according to the present invention. The radio telephone set 60 has four essential building blocks, i.e. a central control and application logic unit 61, a radio unit 62, a timing and synchronisation control unit 63 and a speech processing unit 64.

The radio unit 62 comprises an air interface 65 having an antenna system coupled to a transceiver unit comprising a transmitter/modulator and a receiver/demodulator (not shown).

The timing and synchronisation control unit 63 receives data over the air interface 65 and the radio unit 62 from a base station, which data are processed in accordance with the system clock timing provided by a radio exchange. Signalling and synchronisation information are removed from the received data by the unit 63 and received speech data are fed to the speech processing unit 64. The speech processing unit 64, among others, takes care of the deciphering of received data. A codec 66 decodes the received digitised speech data into a form for making it audible to a user of the handset via a loudspeaker 67 connected to the codec 66.

Speech produced by the user is received by a microphone 68 and encoded into a suitable digital format by the codec 66. This encoded speech data is fed to the speech processing unit 64 which, among others, takes care of encryption of the speech data. The timing and synchronisation control unit 63 adds suitable synchronisation and signalling information to the encrypted speech data. The radio unit 62 transmits this signalling and speech data via the air interface 65 for reception by a base station of the communication system to which the telephone set 60 operatively connects.

The central control and application logic unit 61 comprises a microprocessor or microcontroller and memory means, and connects to the timing and synchronisation control unit 63. The central control unit 61 essentially controls the system data and the communication with the user of the radio telephone set 60 via a keypad means 69, display means 73 and ring generator means 70, all connected to the central control unit 61. Further, an external interface 75 connects to the central control unit 61 for external control and data processing purposes. Frame and time slot allocation and, in the case of a multi-carrier multi-time-slot technology such as DECT, also the various combinations of carrier frequencies and time-slots are controlled by the central control unit 61 and stored in the memory means.

The ring generator means 70 connects to a buzzer 71 for producing a ringing or alerting sound at the arrival of a call. Optionally, a visual alerting signal may be emitted by a lamp or Light Emitting Diode (LED) 72, connected as shown. The display means 73, such as an LCD device, are operatively connected to the central control unit 61 for displaying call information and other user and system data.

For the overall powering of the telephone set 60 a battery and powering unit 74 is included.

In accordance with the present invention, the timing and synchronisation control unit 63 is controlled such to perform.

Although the present invention is generally illustrated with respect to a DECT radio telephone communication system, it is not restricted thereto. The present invention can be used with other TDMA communication systems such as operating in accordance with the GSM (Global System for Mobile communication), PHS (Personal Handyphone System) etc.

What is claimed is:

1. In a Time Division Multiple Access (TDMA) radio communication device arranged for receiving radio signalling and information data in receive time slots, comprising receiver circuitry having control means and filter means for the filtering of received radio signals, wherein said filter means comprise a tunable filter part and a tunable oscillator or resonator part, operatively connected such that control signals operative for the tuning of the oscillator part are also operative for the tuning of the filter part, detector means for the detection of the oscillator operation, reference source means and comparator means, arranged to provide said tuning control signals from said detector means for the tuning of the oscillator to operate in accordance with the reference source means, and storage means for storing said tuning control signals if said filter means are made inoperative and for starting up said filter means by using said stored tuning control signals.

2. In a TDMA radio communication device according to claim 1, comprising timing and synchronisation control means, wherein under the control of said timing and synchronisation control means said tuning control signals are stored at the end of a receive time slot or slots in a frame and wherein said stored tuning control signals of said frame are enabled for starting up said filter means for the receipt of a receive time slot or slots of a subsequent frame.

3. In a TDMA radio communication device according to claim 1, wherein said filter means are digitally controllable filter means and comprising digital storage means for storing said tuning control signals in a digital format.

4. In a TDMA radio communication device according to claim 3, wherein said digital storage means are of a type which, if not operative, can be set in a low power consuming sleep mode.

5. In a TDMA radio communication device according to claim 3, wherein the detector means, comparator means and reference source means are digitally operating means.

6. In a TDMA radio communication device according to claim 1, wherein said detector means comprise amplitude detector means and frequency detector means for the detection of the amplitude and frequency of the output signal of said oscillator part, said reference means being arranged for setting an amplitude and frequency of the oscillator output signal, and wherein said comparator means provide amplitude or quality (Q) tuning control signals and frequency tuning control signals for tuning said oscillator part and said filter part of said filter means.

7. In a TDMA radio communication device according to claim 1, wherein said filter part and said oscillator part comprise tunable transconductor transistor stages.

8. In a TDMA radio communication device according to claim 7, wherein said transconductor stages are digitally tunable by comprising a plurality of differential pairs controlled by a plurality of different dimensioned switchable current means for controlling the current in a differential pair.

9. A transceiver Application Specific Integrated Circuit (ASIC) arranged for use in TDMA radio transceiver means, said ASIC comprising on-chip filter means having a tunable filter part and a tunable oscillator or resonator part, operatively connected such that control signals operative for the tuning of the oscillator part are also operative for the tuning of the filter part, detector means for the detection of the oscillator operation, reference source means and comparator means, arranged to provide said tuning control signals from said detector means for the tuning of the oscillator to operate in accordance with the reference source means, and storage means for storing said tuning control signals if said filter means are made inoperative and for starting up said filter means by using said stored tuning control signals.

10. A radio communication unit for use in a TDMA radio communication system comprising transceiver means, timing and synchronisation control means, and information and signalling processing means, wherein said transceiver means comprise filter means having a tunable filter part and a tunable oscillator or resonator part, operatively connected such that control signals operative for the tuning of the oscillator part are also operative for the tuning of the filter part, detector means for the detection of the oscillator operation, reference source means and comparator means, arranged to provide said tuning control signals from said detector means for the tuning of the oscillator to operate in accordance with the reference source means, and storage means for storing said tuning control signals if said filter means are made inoperative and for starting up said filter means by using said stored tuning control signals.

* * * * *